(12) United States Patent
Lee et al.

(10) Patent No.: US 9,377,678 B2
(45) Date of Patent: Jun. 28, 2016

(54) METHOD OF PROCESSING A SEMICONDUCTOR WAFER SUCH AS TO MAKE PROTOTYPES AND RELATED APPARATUS

(71) Applicant: STMICROELECTRONICS PTE LTD, Singapore (SG)

(72) Inventors: Alan Lee, Singapore (SG); Xi Ge, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 220 days.

(21) Appl. No.: 14/084,773

(22) Filed: Nov. 20, 2013

(65) Prior Publication Data

US 2015/0140479 A1    May 21, 2015

(51) Int. Cl.
*G03F 7/20* (2006.01)
*G03F 1/00* (2012.01)
*G03F 1/42* (2012.01)

(52) U.S. Cl.
CPC .. *G03F 1/00* (2013.01); *G03F 1/42* (2013.01); *G03F 7/70283* (2013.01); *G03F 7/70425* (2013.01)

(58) Field of Classification Search
USPC ........................................... 430/5, 394
See application file for complete search history.

(56) References Cited

U.S. PATENT DOCUMENTS

2008/0055577 A1*   3/2008   Smeets ................. G03F 1/14
355/53

* cited by examiner

*Primary Examiner* — Daborah Chacko Davis
(74) *Attorney, Agent, or Firm* — Allen, Dyer, Doppelt, Milbrath & Gilchrist, P.A.

(57) ABSTRACT

A method of processing a semiconductor wafer may include providing a rotatably alignable photolithography mask that includes different mask images. Each mask image may be in a corresponding different mask sector. The method may also include performing a series of exposures with the rotatably alignable photolithography mask at different rotational alignments with respect to the semiconductor wafer so that the different mask images produce at least one working semiconductor wafer sector, and at least one non-working semiconductor wafer sector.

20 Claims, 6 Drawing Sheets

METHOD OF PROCESSING A SEMICONDUCTOR WAFER SUCH AS TO MAKE PROTOTYPES AND RELATED APPARATUS

TECHNICAL FIELD

The present disclosure relates to the semiconductor devices, and, more particularly, to methods of processing semiconductor wafers and related apparatus.

BACKGROUND

Semiconductor device design may be a relatively expensive research and development endeavor. A significant portion of research and development spending in the design of a semiconductor device may be the design of the photolithography mask. A mask is typically an opaque plate with holes or transparencies that allow light to shine through in a defined pattern defining mask images. A mask typically includes transparent fused silica blanks covered with one or more mask images that may be defined with a chrome metal-absorbing film. A set of masks, wherein each includes a mask image that defines a pattern layer in integrated circuit fabrication, may be fed into a photolithography stepper or scanner, and individually selected for exposure.

Accordingly, due to the relatively high cost of mask design, funding an immature concept or project may be typically very challenging in terms of balancing risk or cost versus gain or potential business, for example. Thus, reducing the cost of designing a semiconductor device, and more particularly, the mask design cost, may encourage additional research and development. For example, a lower cost threshold may allow a research and development project, that may typically not be undertaken because of cost, to be undertaken. Additionally, the initial design cost may be particularly important since for many research and development projects, a few devices or chips may be all that is needed to perform a technological feasibility study, for example.

Currently, a full mask set is designed for each semiconductor device desired, whether for production or a prototype. In other words, one layer or one mask is designed, which is the same as for production, to achieve relatively acceptable or working chips on the entire wafer, for example.

SUMMARY

A method of processing a semiconductor wafer may include providing a rotatably alignable photolithography mask that includes different mask images. Each mask image may be in a corresponding different mask sector. The method may also include performing a series of exposures with the rotatably alignable photolithography mask at different rotational alignments with respect to the semiconductor wafer so that the different mask images produce at least one working semiconductor wafer sector, and at least one non-working semiconductor wafer sector. Accordingly, a reduced number of photolithography masks may be used, for example, thereby reducing overall costs such as for creating a prototype integrated circuit (IC).

The plurality of different mask images may include between two and four mask images. The at least one working semiconductor wafer sector may include a single working semiconductor wafer quadrant, for example. A next mask image may be rotated 90-degrees relative to a preceding mask image.

The rotatably alignable photolithography mask may include alignment indicia, for example. Performing the series of exposures may include performing the series of exposures with the rotatably alignable photolithography mask rotatably aligned based upon the alignment indicia, for example.

The method may further include providing at least one other rotatably alignable photolithography mask and performing another series of exposures therewith. The at least one working semiconductor sector may include a plurality of working integrated circuits (ICs), for example.

Another aspect is directed to a rotatably alignable photolithography mask for processing a semiconductor wafer. The rotatably alignable photolithography mask may include a photolithography mask transparent substrate and at least one mask image layer thereon. The at least one mask image layer defines a plurality of different mask images with each mask image in a corresponding different mask sector so that upon performing a series of exposures with the rotatably alignable photolithography mask at different rotational alignments with respect to the semiconductor wafer. The different mask images produce at least one working semiconductor wafer sector, and at least one non-working semiconductor wafer sector.

DETAILED DESCRIPTION

The embodiments will now be described more fully hereinafter with reference to the accompanying drawings. The embodiments may be in many different forms and should not be construed as limited to those set forth herein. Rather, these embodiments are provided so that this disclosure will be thorough and complete, and will fully convey the scope of the embodiments to those skilled in the art. Like numbers refer to like elements throughout.

Figure 1A:
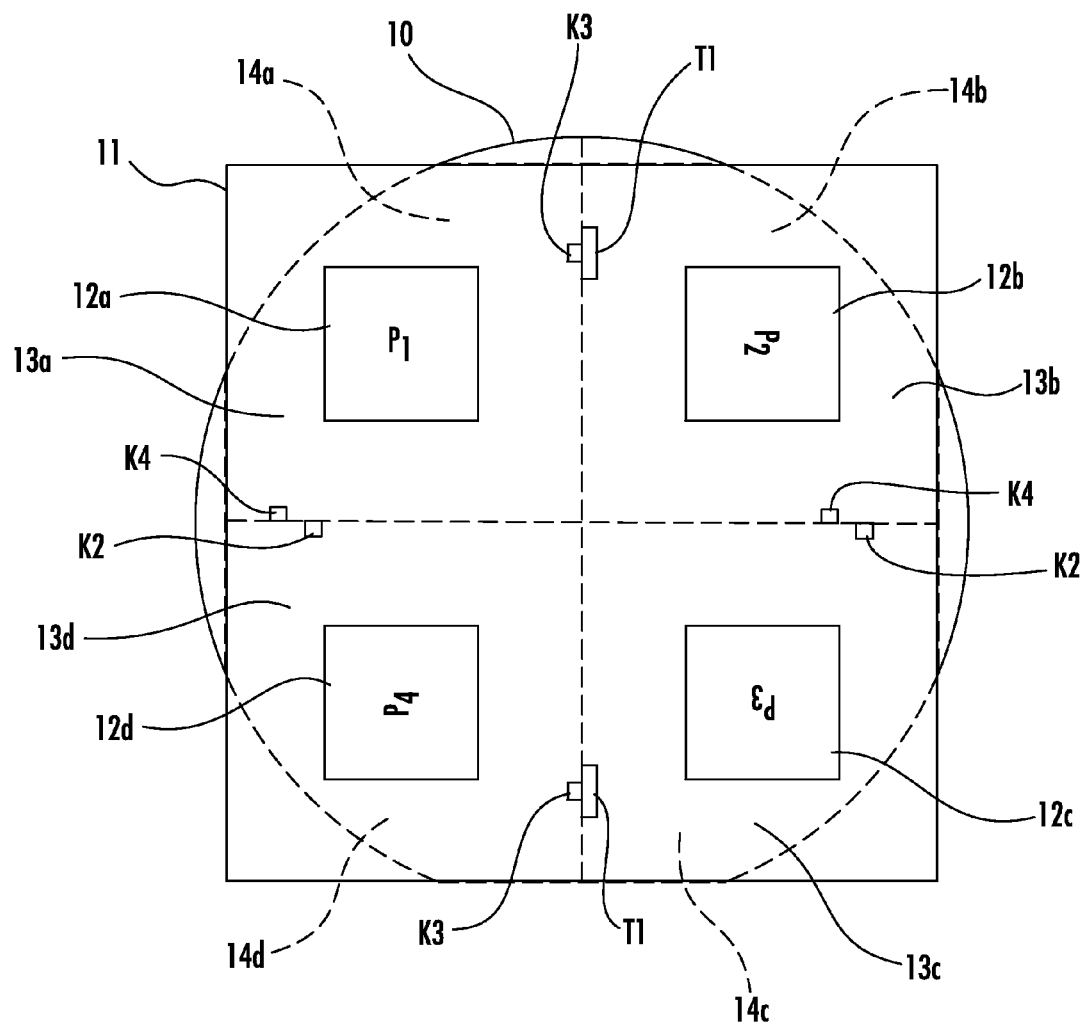
FIGS. 1a-1d are schematic plan views of a rotatably alignable photolithography mask at different rotational alignments according to an embodiment.
Figure 2:
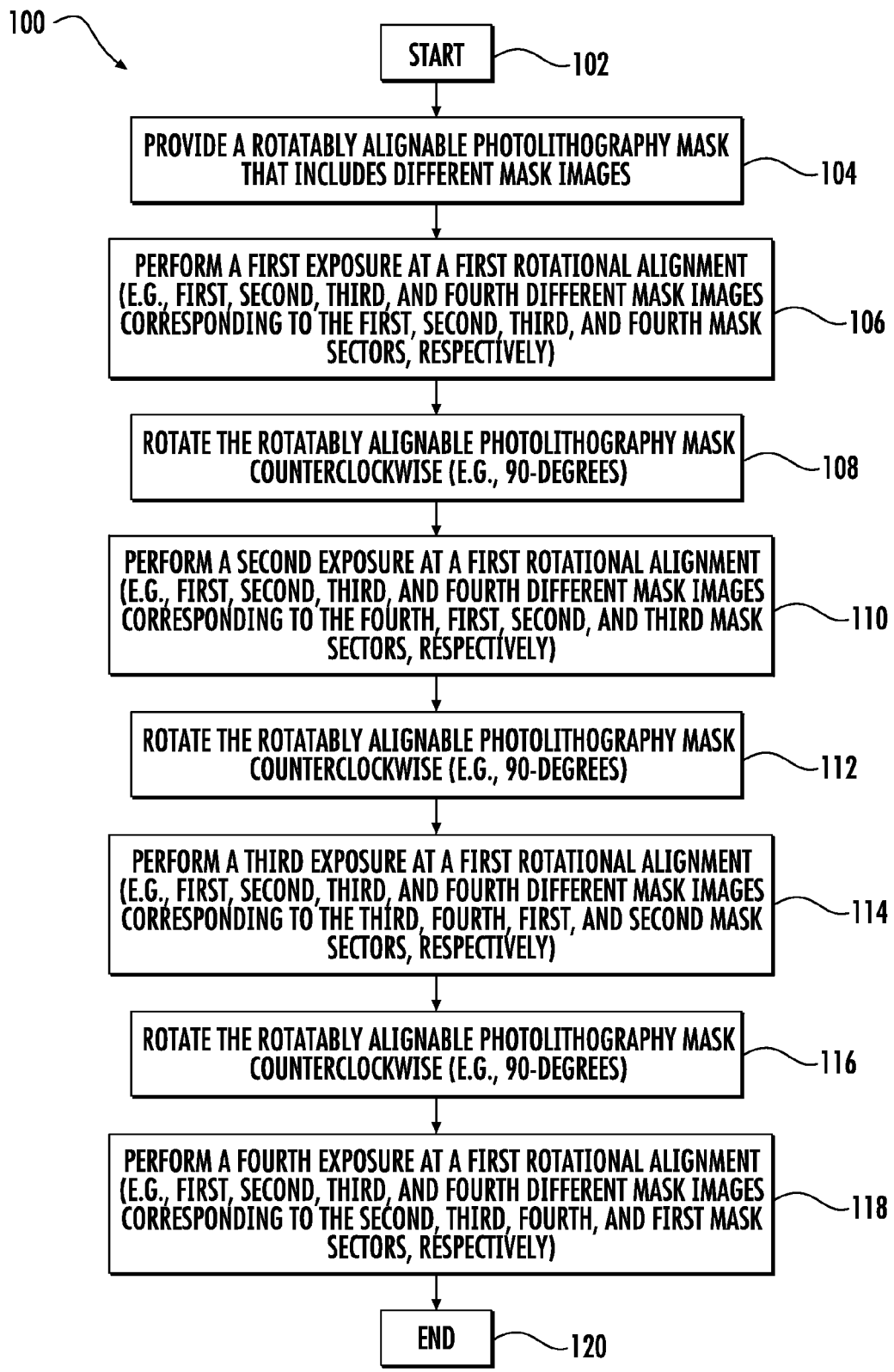
FIG. 2 is a flow chart of a method of processing a semiconductor wafer according to an embodiment.
Figure 3:
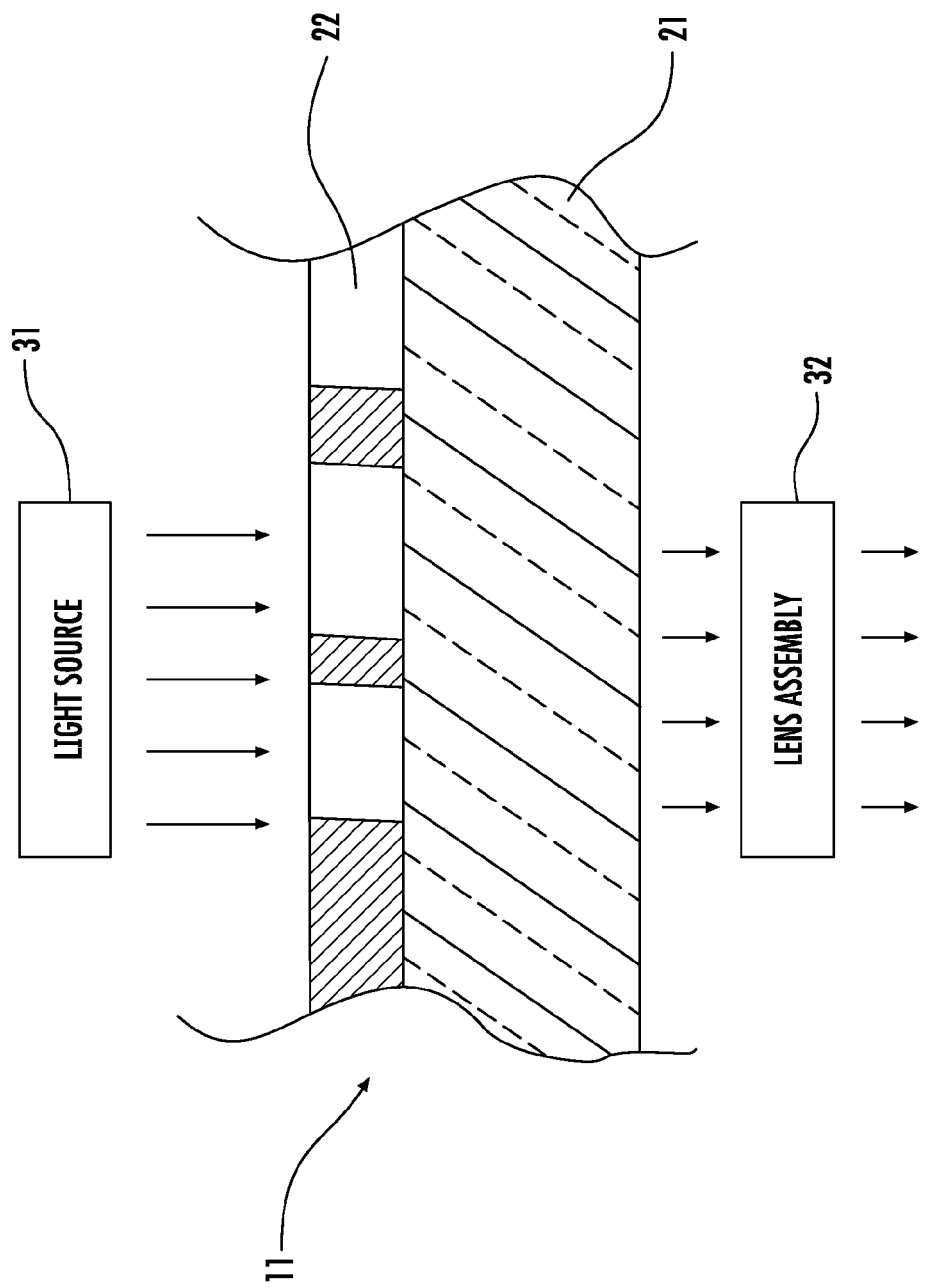
FIG. 3 is a schematic diagram of a system for processing a semiconductor wafer including a cross-sectional view of a portion of a rotatably alignable photolithography mask according to an embodiment.

Referring initially to FIG. 1a and beginning at Block 102 in the flowchart 100 in FIG. 2, a method of processing a semiconductor wafer 10 is illustrated. At Block 104, the method includes providing a rotatably alignable photolithography mask 11 that includes different mask images 12a-12d. Referring briefly to FIG. 3, the rotatably alignable photolithography mask 11 includes a photolithography mask transparent substrate 21 and a mask image layer 22 thereon. As will be appreciated by those skilled in the art, the photolithography transparent substrate 21 may be a fused silica blank, and the mask image layer 22 may be defined by a chrome metal-absorbing film. A photolithography light source or illuminator 31 that illuminates the rotatably alignable photolithography mask 11. The light passes through the rotatably alignable photolithography mask 11, including the photolithography mask transparent substrate 21 and the mask image layer 22 thereon, and through a lens assembly 32 to expose the semiconductor wafer 10 to the corresponding different mask image 12a-12d, as will be explained in further detail below.

Illustratively there are four different mask images 12a-12d, but it will appreciated by those skilled in the art that there may be any number of mask images, such as between two and four mask images. Each mask image 12a-12d is in a corresponding different mask sector 13a-13d. Each different mask image 12a-12d is oriented 90-degrees from an adjacent mask image, the orientation of which is indicated by the symbols $P_1$-$P_4$ in FIG. 1a. The rotatably alignable photolithography mask 11 is illustratively square in shape, but can be another shape.

A series of exposures are performed with the rotatably alignable photolithography mask 11 at different rotational alignments with respect to the semiconductor wafer 10 so that the different mask images 12a-12d produce at least one working semiconductor wafer sector, and more particularly, since four different mask images are illustrated, a single working semiconductor wafer quadrant 14a (FIGS. 1a-1d). In other embodiments, more than one working semiconductor wafer sector may be produced. At least one non-working semiconductor wafer sector is also produced by the series of exposures, and more particularly, for the four different mask images 12a-12d, three non-working semiconductor wafer sectors 14b-14d are produced. The working semiconductor wafer quadrant 14a or working sector may include working integrated circuits (ICs), for example, prototype ICs.

Further details of the series of exposures performed with the rotatably alignable photolithography mask 11 will now be described. At Block 106, a first exposure is performed so that the first mask image 12a corresponds to the first mask sector 13a, the second mask image 12b corresponds to the second mask sector 13b, the third mask image 12c corresponds to the third mask sector 13c, and the fourth mask image 12d corresponds to the fourth mask sector 13d (FIG. 1a). The rotatably alignable photolithography mask 11 is rotated 90-degrees counterclockwise at Block 108. Of course, in another embodiment, the rotatably alignable photolithography mask 11 may be rotated clockwise.

Figure 1B:
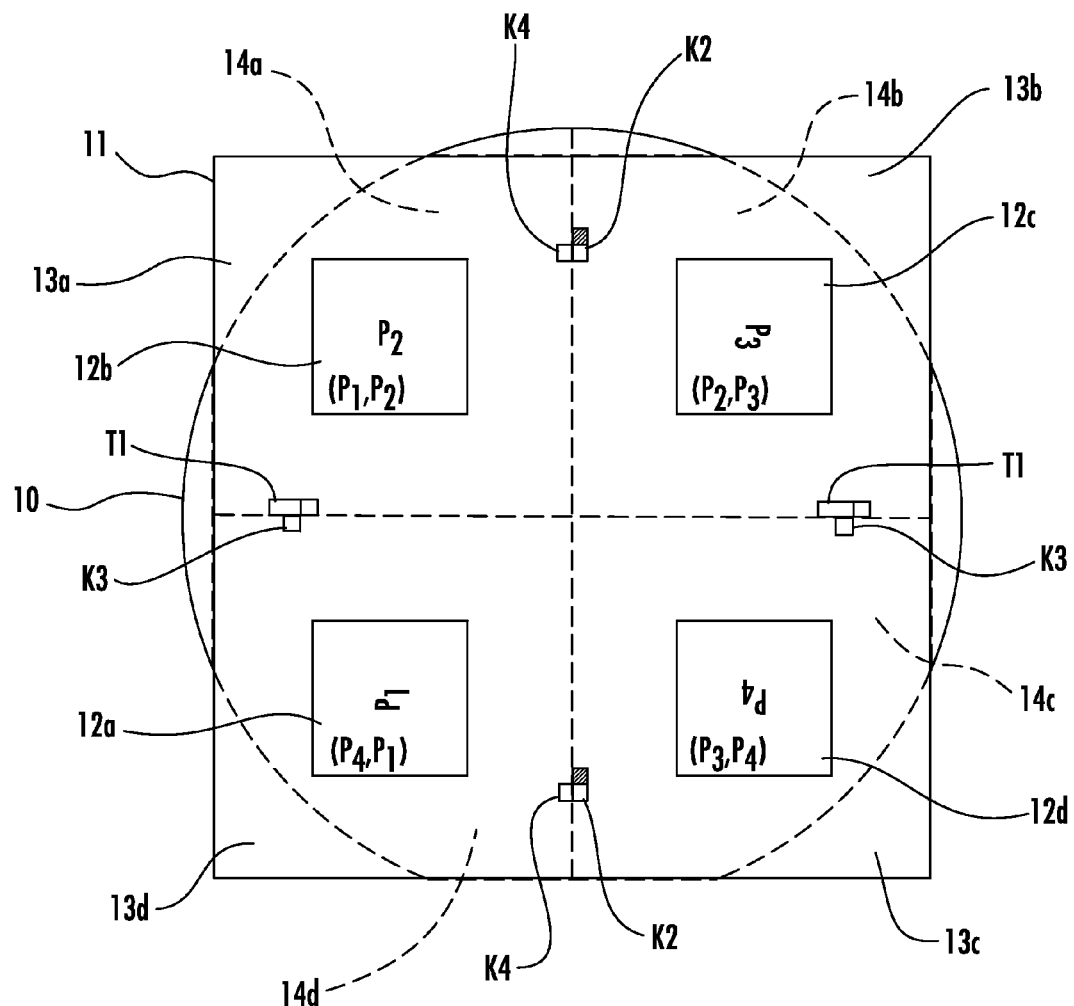

At Block 110, a second exposure is performed so that the first mask image 12a corresponds to the fourth mask sector 13d, the second mask image 12b corresponds to the first mask sector 13a, the third mask image 12c corresponds to the second mask sector 13b, and the fourth mask image 12d corresponds to the third mask sector 13c (FIG. 1b). The composite exposure is thus, for the following semiconductor wafer sectors:

14a: 12a, 12b; ($P_1$,$P_2$)
14b: 12b, 12c; ($P_2$,$P_3$)
14c: 12c, 12d; ($P_3$,$P_4$) and
14d: 12d, 12a ($P_4$,$P_1$).

For ease of understanding, in FIGS. 1a-1d of the drawings the symbols $P_1$-$P_4$ correspond to the location (e.g., sector) an orientation of the first through fourth mask images 12a-12d in a given exposure. The composite exposures for a given mask sector 13a-13d are in parentheses under the respective P symbol. For example, the symbol $P_1$, $P_2$ indicates that for a given mask sector the order of exposure of the mask images is the first mask image 12a followed by the second mask image 12b. This notation is used throughout FIGS. 1a-1d.

Figure 1C:
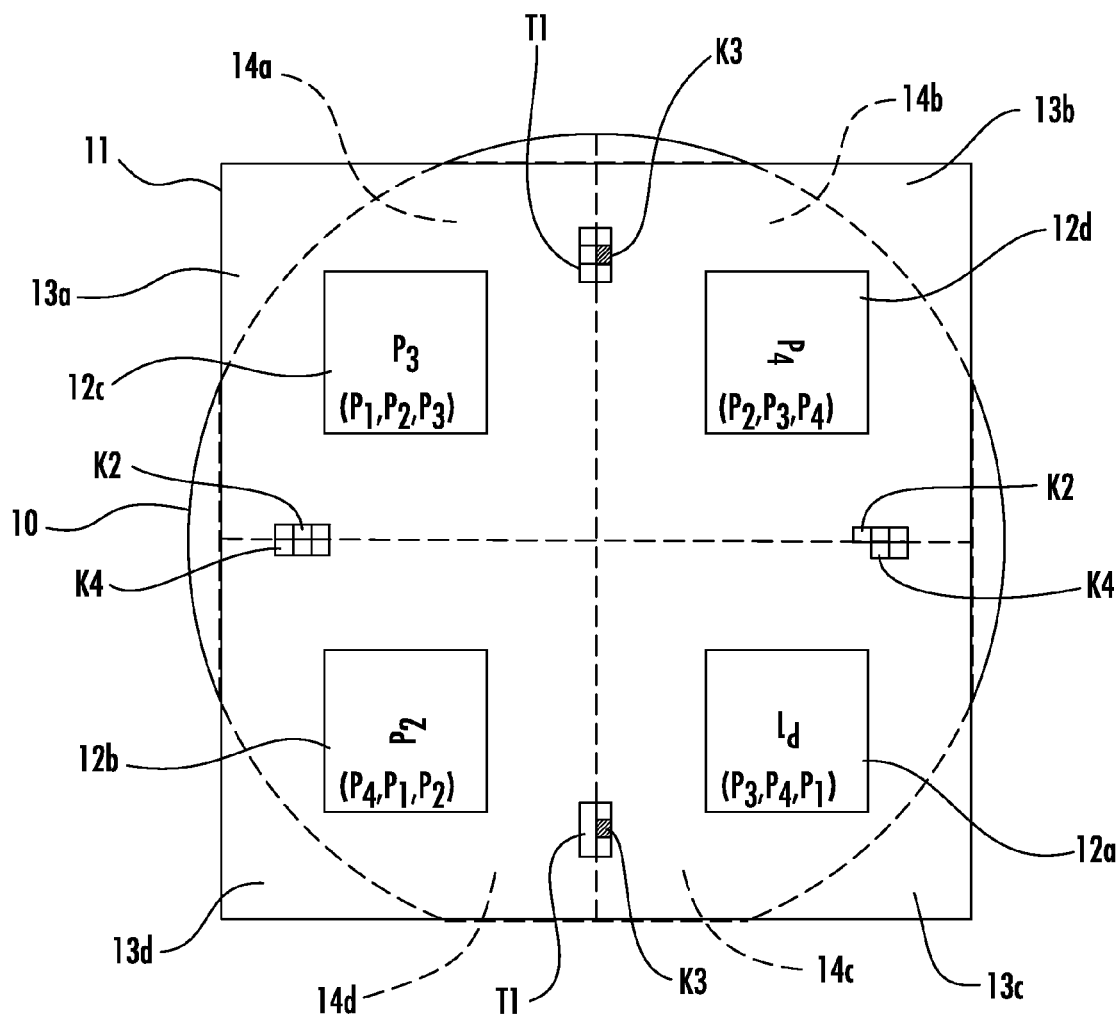

At Block 112, the rotatably alignable photolithography mask 11 is again rotated 90-degrees. A third exposure is performed so that the first mask image 12a corresponds to the third mask sector 13c, the second mask image 12b corresponds to the fourth mask sector 13d, the third mask image 12c corresponds to the first mask sector 13a, and the fourth mask image 12d corresponds to the second mask sector 13b (Block 112) (FIG. 1c). The composite exposure is thus, for the following semiconductor wafer sectors:

14a: 12a, 12b, 12c ($P_1$,$P_2$,$P_3$);
14b: 12b, 12c, 12d ($P_2$,$P_3$,$P_4$);
14c: 12c, 12d, 12a ($P_3$,$P_4$,$P_1$); and
14d: 12d, 12a, 12b ($P_4$,$P_1$,$P_2$).

Figure 1D:
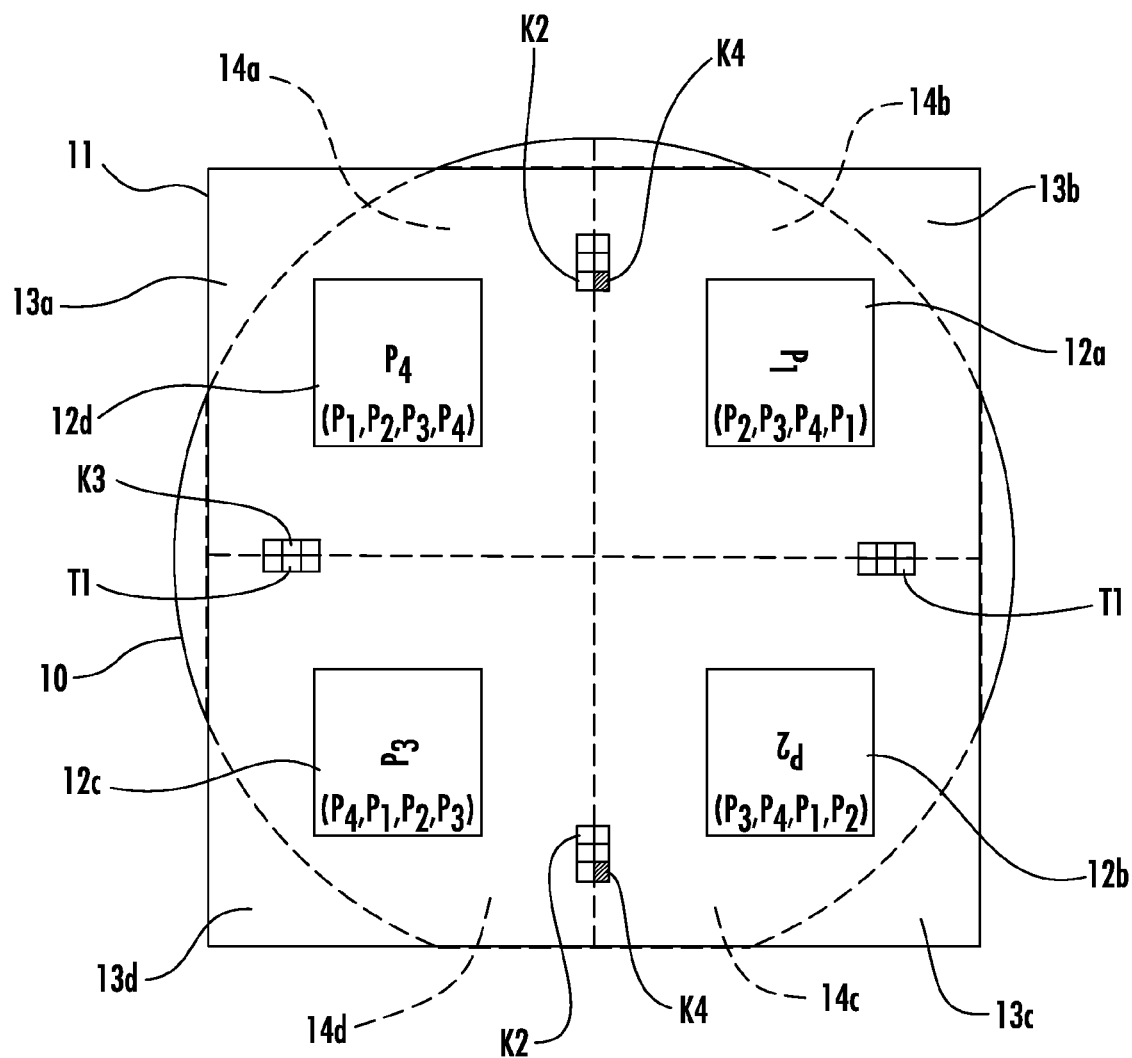

The rotatably alignable photolithography mask is rotated 90-degrees at Block 116. At Block 118, a fourth exposure is performed so that the first mask image 12a corresponds to the second mask sector 13b, the second mask image 12b corresponds to the third mask sector 13c, the third mask image 12c corresponds to the fourth mask sector 13d, and the fourth mask image 12d corresponds to the first mask sector 13a (FIG. 1d). The composite exposure is thus, for the following semiconductor wafer sectors:

14a: 12a, 12b, 12c, 12d ($P_1$,$P_2$,$P_3$,$P_4$);
14b: 12b, 12c, 12d, 12a ($P_2$,$P_3$,$P_4$,$P_1$);
14c: 12c, 12d, 12a, 12b ($P_3$,$P_4$,$P_1$,$P_2$); and
14d: 12d, 12a, 12b, 12c ($P_4$,$P_1$,$P_2$,$P_3$).

The method ends at Block 120. It should be appreciated that in some embodiments, one or more other rotatably alignable photolithography masks may be provided and another series of exposures, which may be the same or different, may be performed.

While a 90-degree rotation of the rotatably alignable photolithography mask 11 has been described, the rotatably alignable photolithography mask may be rotated by another degree amount. However, a 90-degree rotation may be, in terms of mask design, desirable since many projection masks may be divided into four independent quadrants and different mask images in each quadrant can be rotated at a ninety-degree angle against the neighboring sector.

The rotatably alignable photolithography mask 11 includes alignment indicia T1, K2, K3, K4 thereon. The alignment indicia T1, K2, K3, K4 may be advantageous for aligning the rotatably alignable photolithography mask after each 90-degree rotation. The T1 indication corresponds to the alignment target printed with the $P_1$ exposure. The K2 indication corresponds to an alignment indication or key for the $P_2$ exposure, and the K3 indication corresponds to an alignment indication or key for the $P_3$ exposure. The K4 indication corresponds to an alignment indication or key for the $P_4$ exposure.

For example, there may be two groups of alignment indicia T1, K2, K3, K4 (four total indices). One group may be placed adjacent a top of the rotatably alignable photolithography mask 11 and another adjacent the bottom of the rotatably alignable photolithography mask. As the rotatably alignable photolithography mask 11 is rotated, it is desirable that the two groups of alignment indicia T1, K2, K3, K4 align in the X direction. As the rotatably alignable photolithography mask 11 is rotated, the alignment indicia T1, K2, K3, K4 may overlap, but alignment determined in the X direction. The overlapping of the alignment indicia is illustrated in FIGS. 1a-1d. In particular, as the rotatably alignable photolithography mask 11 is rotated, K2 aligns with T1 (FIG. 1B), K3 aligns with T1 (FIG. 1C), and K4 aligns with T1 (FIG. 1D).

As will be appreciated by those skilled in the art, the working semiconductor wafer sector or working semiconductor wafer quadrant 14a has the desired sequencing of exposures of the mask images, e.g., 12a, 12b, 12c, 12d ($P_{a,b,c,d}$). In other words, only a single sector or quadrant of the semiconductor wafer 10, e.g. 14a has the desired sequencing of exposures, while the other three sectors or quadrants do not and are thus planned to be non-working and discarded. Using the rotatably alignable photolithography mask 11 described herein (a different mask image in a corresponding different mask sector) instead a full set initial research and development photolithography masks may reduce mask costs up to 75%, for example.

In contrast, in prior art approaches, a standard projection photolithography mask layout includes two groups of auto-alignment marks, a test pattern and the chip design on whole mapping. In this configuration, one mask image is included in the single photolithography mask, which is using the same layout. Multiple photolithography masks are aligned using alignment indicia, and an exposure is performed using each photolithography mask to obtain the desired sequencing over the entire semiconductor wafer. In terms of cost, the prior art approach is more costly since it uses more photolithography masks. Indeed, according to the embodiments described herein, while three-quarters of the semiconductor wafer 10 are unusable or discarded, the cost of discarding any portion of the semiconductor wafer is less than designing or forming several, for example, four photolithography masks. Table 1 below illustrates the benefits of the rotatably alignable photolithography mask 11 and related method described herein with respect to prior art approaches.

TABLE 1

| | Total Number of Photolithography Masks (Prior Art) | | | | | | | |
|---|---|---|---|---|---|---|---|---|
| | 2 | 3 | 4 | 5 | 6 | 7 | 8 | 9 |
| Total Number of Rotatably Alignable Photolithography Masks | 1 | 1 | 1 | 2 | 2 | 2 | 2 | 3 |
| Savings on Photolithography Masks | 50% | 66% | 75% | 60% | 66% | 71% | 75% | 66% |

In terms of research and development costs, the rotatably alignable photolithography mask 11 and related method described herein may save upwards of 75%. For example, a standard research and development photolithography mask set cost may be about $40,000, while the research and development photolithograph cost using the rotatably alignable photolithography mask 11 and related method described herein may be about $11,000. In particular, for a standard research and development costing $40,000, a first cut of a photolithography mask may cost about $8,000 for eight masks, and fine-tuning for three masks costs $3,000. A second cut of photolithography masks may also cost $8,000 for eight masks, and a second cut option may cost $4,000 for four masks. A third cut may cost $8,000 for eight masks, a fourth cut may also cost $8,000 for eight masks, and a fourth cut option for one mask may cost $1,000 for one mask.

In contrast, for research and development according to the method described herein, a first cut for eight masks may cost $2,000, and fine-tuning for three masks may cost $1,000. A second cut of photolithography masks may also cost $2,000 for eight masks, and a second cut option may cost $1,000 for four masks. A third cut may cost $2,000 for eight masks, a fourth cut may also cost $2,000 for eight masks, and a fourth cut option for one mask may cost $1,000 for one mask. Accordingly, a cost savings of about $29,000 may be realized.

Many modifications and other embodiments will come to the mind of one skilled in the art having the benefit of the teachings presented in the foregoing descriptions and the associated drawings. Therefore, it is understood that the embodiments are not to be limited to the specific embodiments disclosed, and that modifications are intended to be included within the scope of the appended claims.

That which is claimed is:

1. A method of processing a semiconductor wafer comprising:
   providing a rotatably alignable photolithography mask comprising a plurality of different mask images, each mask image in a corresponding different mask sector; and
   performing a series of exposures with the rotatably alignable photolithography mask at different rotational alignments with respect to the semiconductor wafer so that the different mask images produce corresponding stacked composite exposures for each of a plurality of semiconductor wafer sectors, the plurality of semiconductor wafer sectors comprising at least one working semiconductor wafer sector having an operational composite exposure order, and at least one non-working semiconductor wafer sector having a non-operational composite exposure order.

2. The method of claim 1, wherein the plurality of different mask images comprises between two and four mask images.

3. The method of claim 1, wherein the at least one working semiconductor wafer sector comprises a single working semiconductor wafer quadrant.

4. The method of claim 1, wherein a next mask image is rotated 90-degrees relative to a preceding mask image.

5. The method of claim 1, wherein the rotatably alignable photolithography mask comprises alignment indicia.

6. The method of claim 5, wherein performing the series of exposures comprises performing the series of exposures with the rotatably alignable photolithography mask rotatably aligned based upon the alignment indicia.

7. The method of claim 1, further comprising providing at least one other rotatably alignable photolithography mask and performing another series of exposures therewith.

8. The method of claim 1, wherein the at least one working semiconductor sector comprises a plurality of working integrated circuits (ICs).

9. The method of claim 8, wherein the plurality of working ICs comprise prototype ICs.

10. A method for making prototype integrated circuits (ICs) from a semiconductor wafer comprising:
    providing a rotatably alignable photolithography mask comprising a plurality of different mask images, each mask image in a corresponding different mask sector; and
    performing a series of exposures with the rotatably alignable photolithography mask at different rotational alignments with respect to the semiconductor wafer so that the different mask images produce corresponding stacked composite exposures for each of a plurality of semiconductor wafer sectors, the plurality of semiconductor wafer sectors comprising at least one prototype semiconductor wafer sector having an operational composite exposure order, and at least one non-prototype semiconductor wafer sector having a non-operational composite exposure order, with the at least one prototype semiconductor wafer sector comprising a plurality of prototype ICs.

11. The method of claim 10, wherein the plurality of different mask images comprises between two and four mask images.

12. The method of claim 10, wherein the at least one prototype semiconductor wafer sector comprises a prototype semiconductor wafer quadrant.

13. The method of claim 10, wherein the rotatably alignable photolithography mask comprises alignment indicia; and wherein performing the series of exposures comprises performing the series of exposures with the rotatably alignable photolithography mask rotatably aligned based upon the alignment indicia.

14. The method of claim 10, further comprising providing at least one other rotatably alignable photolithography mask and performing another series of exposures therewith.

15. A method of processing a semiconductor wafer comprising:
performing a series of exposures with a rotatably alignable photolithography mask at different rotational alignments with respect to the semiconductor wafer, the rotatably alignable photolithography mask comprising a plurality of different mask images with each mask image in a corresponding different mask sector so that the different mask images produce corresponding stacked composite exposures for each of a plurality of semiconductor wafer sectors, the plurality of semiconductor wafer sectors comprising at least one working semiconductor wafer sector having an operational composite exposure order, and at least one non-working semiconductor wafer sector having a non-operational composite exposure order.

16. The method of claim 15, wherein the plurality of different mask images comprises between two and four mask images.

17. The method of claim 15, wherein the at least one working semiconductor wafer sector comprises a working semiconductor wafer quadrant.

18. The method of claim 15, wherein the rotatably alignable photolithography mask comprises alignment indicia; and wherein performing the series of exposures comprises performing the series of exposures with the rotatably alignable photolithography mask rotatably aligned based upon the alignment indicia.

19. The method of claim 15, further comprising providing at least one other rotatably alignable photolithography mask and performing another series of exposures therewith.

20. The method of claim 15, wherein the at least one working semiconductor sector comprises a plurality of working integrated circuits (ICs).

* * * * *